(12) United States Patent
Feng et al.

(10) Patent No.: US 8,946,854 B2
(45) Date of Patent: Feb. 3, 2015

(54) METAL-INSULATOR-METAL CAPACITOR STRUCTURE AND METHOD FOR MANUFACTURING THE SAME

(75) Inventors: Ji Feng, Singapore (SG); Duan-Quan Liao, Singapore (SG); Hai-Long Gu, Singapore (SG); Ying-Tu Chen, Singapore (SG)

(73) Assignee: United Microelectronics Corporation, Hsinchu (TW)

( * ) Notice: Subject to any disclaimer, the term of this patent is extended or adjusted under 35 U.S.C. 154(b) by 276 days.

(21) Appl. No.: 13/292,156

(22) Filed: Nov. 9, 2011

(65) Prior Publication Data
US 2013/0113075 A1    May 9, 2013

(51) Int. Cl.
*H01L 29/02* (2006.01)
*H01L 23/522* (2006.01)
*H01L 49/02* (2006.01)

(52) U.S. Cl.
CPC ........... *H01L 23/5223* (2013.01); *H01L 28/60* (2013.01)
USPC ........... 257/532; 257/E21.008; 257/E21.011; 257/E21.648

(58) Field of Classification Search
CPC ..... H01L 27/0805; H01L 28/40; H01L 28/60; H01L 23/5223; H01L 28/55; H01L 21/76838; H01L 23/5222; H01L 27/10852; H01L 27/10894; H01L 28/75; H01L 21/76895; H01L 27/1085; H01L 21/3212; H01L 21/76
USPC ........... 257/532, E29.002, E21.008, E21.011, 257/E21.648, E21.579, E27.088, E21.021, 257/E29.343, 758; 438/381, 239, 253, 386, 438/238
See application file for complete search history.

(56) References Cited

U.S. PATENT DOCUMENTS

| | | | |
|---|---|---|---|
| 6,387,775 B1 | 5/2002 | Jang et al. | |
| 6,677,635 B2 | 1/2004 | Ning et al. | |
| 2003/0025143 A1* | 2/2003 | Lin et al. | 257/303 |
| 2004/0232557 A1* | 11/2004 | Kim | 257/758 |
| 2005/0161765 A1* | 7/2005 | Tsau | 257/528 |
| 2005/0274987 A1 | 12/2005 | Coolbaugh et al. | |
| 2008/0064163 A1* | 3/2008 | Coolbaugh et al. | 438/253 |
| 2010/0129978 A1* | 5/2010 | Kim | 438/393 |
| 2013/0271938 A1* | 10/2013 | Lindert et al. | 361/782 |

* cited by examiner

Primary Examiner — Stephen W Smoot
Assistant Examiner — Edward Chin
(74) *Attorney, Agent, or Firm* — WPAT, PC; Justin King

(57) ABSTRACT

A metal-insulator-metal (MIM) capacitor structure includes a first dielectric layer, a first damascene electrode layer, an insulating barrier layer, a second dielectric layer and a second damascene electrode layer. The first damascene electrode layer is formed in the first dielectric layer. The insulating barrier layer covers the first dielectric layer and the first damascene electrode layer, and is a single layer structure. The second dielectric layer is formed on the insulating barrier layer. The second damascene electrode layer is formed in the second dielectric layer and is contacted with the insulating barrier layer. The MIM capacitor structure can includes a dual damascene structure formed in the second dielectric layer and the insulating barrier layer and electrically connected to the first damascene electrode layer. A method for manufacturing the MIM capacitor structure is also provided.

8 Claims, 5 Drawing Sheets

METAL-INSULATOR-METAL CAPACITOR STRUCTURE AND METHOD FOR MANUFACTURING THE SAME

FIELD OF THE INVENTION

The present invention relates to a capacitor structure, and particularly to a metal-insulator-metal (MIM) capacitor structure and a method for manufacturing the same.

BACKGROUND OF THE INVENTION

Generally, a MIM capacitor comprises two metal electrodes separated by an insulator. The MIM capacitor has advantages of small size, stable capacitor value and little parasitic effect, and so on.

With the development of the integrated circuit technology, the MIM capacitor has been widely used so as to improve the performance of the integrated circuit. Currently, in order to electrically connect the MIM capacitor with other electronic components, the MIM capacitor is usually integrated with an interconnection structure. However, in a conventional process for integrating the MIM capacitor with the interconnection structure, it is necessary to form a number of insulating layers and a number of metal layers. Thus, the conventional process for integrating the MIM capacitor with the interconnection structure a number of depositing steps and etching steps, thereby increasing the production cost and causing the final integrated structure to be complicated.

SUMMARY OF THE INVENTION

The present invention provides a MIM capacitor with a simple structure so as to reduce the production cost.

The present invention also provides a method for manufacturing a MIM capacitor, which has a simple process so as to reduce the production cost.

The present invention provides a MIM capacitor including a first dielectric layer, a first damascene electrode layer, an insulating barrier layer, a second dielectric layer and a second damascene electrode layer. The first damascene electrode layer is formed in the first dielectric layer. The insulating barrier layer covers the first dielectric layer and the first damascene electrode layer, and is a single layer structure. The second dielectric layer is formed on and contacted with the insulating barrier layer. The second damascene electrode layer is formed in the second dielectric layer, is located on the first damascene electrode layer and is contacted with the insulating barrier layer.

In one embodiment of the present invention, the insulating barrier layer is selected from a group consisting of silicon nitride (SiN), silicon carbide (SiC), silicon carbonitride (SiCN) and silicon oxynitride (SiON).

In one embodiment of the present invention, a material of the first damascene electrode layer and a material of the second damascene electrode layer are copper.

The present invention also provides a MIM capacitor including a first dielectric layer, a first damascene electrode layer, an insulating barrier layer, a second dielectric layer, a second damascene electrode layer and a dual damascene structure. The first damascene electrode layer is formed in the first dielectric layer. The insulating barrier layer is formed on the first dielectric layer and the first damascene electrode layer. The second dielectric layer is formed on the insulating barrier layer. The second damascene electrode layer is formed in the second dielectric layer, is located on the first damascene electrode layer, and is contacted with the insulating barrier layer. The dual damascene structure is formed in the second dielectric layer and the insulating barrier layer, is located on the first damascene electrode layer, and is electrically connected to the first damascene electrode layer.

In one embodiment of the present invention, the insulating barrier layer is a single layer structure.

In one embodiment of the present invention, a material of insulating barrier layer is selected from a group consisting of silicon nitride (SiN), silicon carbide (SiC), silicon carbonitride (SiCN) and silicon oxynitride (SiON).

In one embodiment of the present invention, a material of the first damascene electrode layer and a material of the second damascene electrode layer are copper.

In one embodiment of the present invention, a material of the second damascene electrode layer is identical to a material of the dual damascene structure.

In one embodiment of the present invention, the insulating barrier layer is a multilayer structure.

In one embodiment of the present invention, the multilayer structure includes a first insulating layer formed on the first dielectric layer and a second insulating layer formed on the first insulating layer. A material of the first insulating layer is selected from a group consisting of silicon nitride (SiN), silicon carbide (SiC), silicon carbonitride (SiCN) and silicon oxynitride (SiON). A material of the second insulating layer is selected from a group consisting of undoped silicate glass (USG), tantalum oxide ($Ta_2O_5$), zirconium oxide ($ZrO_2$) and aluminum oxide ($Al_2O_3$).

The present invention also provides a method for manufacturing a MIM capacitor. At first, a first opening is formed in a first dielectric layer. A first damascene electrode layer is filled in the first opening. Next, an insulating barrier layer is formed to cover the first dielectric layer and the first damascene electrode layer. The insulating barrier layer is a single layer structure. Next, a second dielectric is formed on and contacted with the insulating barrier layer. A second opening is formed in the second dielectric layer and is located above the first damascene electrode layer to expose a portion of the insulating barrier layer therefrom. Next, a second damascene electrode layer is filled in the second opening and is contacted with the insulating barrier layer.

In one embodiment of the present invention, a material of the insulating barrier layer is selected from a group consisting of silicon nitride (SiN), silicon carbide (SiC), silicon carbonitride (SiCN) and silicon oxynitride (SiON).

In one embodiment of the present invention, a material of the first damascene electrode layer and a material of the second damascene electrode layer are copper.

In one embodiment of the present invention, the method further includes the following steps. At first, a dual damascene opening is formed in the second dielectric layer and the insulating barrier layer and is located above the first damascene electrode layer to expose the first damascene electrode layer therefrom. Next, a dual damascene structure is filled in the dual damascene opening and is electrically connected to the first damascene electrode layer.

In one embodiment of the present invention, forming the dual damascene opening including the following steps. At first, during forming the second opening, a third opening is formed in the second dielectric layer at the same time and is located above the first damascene electrode layer to expose a portion of the insulating barrier layer. Next, the portion of the insulating barrier layer exposed from the third opening is removed so as to expose a portion of the first damascene electrode layer, thereby forming the dual damascene opening.

In one embodiment of the present invention, removing the portion of the insulating barrier layer exposed from the third opening includes the following steps. At first, a patterned mask layer is formed on the second dielectric layer to cover the second opening and to expose the third opening. Next, the portion of the insulating barrier layer exposed from the patterned mask is removed. Next, the patterned mask layer is removed.

In the MIM capacitor and the method for manufacturing the MIM capacitor of the present invention, the first damascene electrode layer and the second damascene electrode layer are both formed by a damascene process and are separated by the insulating barrier layer. The insulating barrier layer is a single layer structure. The insulating barrier can serve as not only an insulator of the MIM capacitor, but also an etch stop layer during forming the second damascene electrode layer. Thus, the MIM capacitor has a simple structure, thereby reducing the production cost. In another embodiment, the MIM capacitor can further includes the dual damascene structure formed in the second dielectric layer and the insulating barrier layer and electrically connected to the first damascene electrode layer. The dual damascene structure and the second damascene electrode layer can be formed in a common step. Thus, the process of integrating the MIM capacitor with an interconnection structure can be simplified, thereby reducing the production cost.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A-1E illustrate a process flow of a method for manufacturing a MIM capacitor in accordance with a first embodiment of the present invention.

Figure 1A:
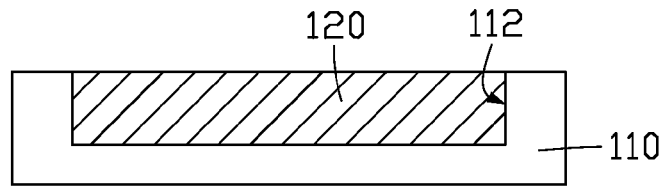
FIGS. 1A-1E illustrate a process flow of a method for manufacturing a MIM capacitor in accordance with a first embodiment of the present invention.

Referring to FIG. 1A, in the present embodiment, for example, a first damascene electrode layer 120 is formed in a first dielectric layer 110 by a damascene process. In detail, at first, a first opening 112 is formed in the first dielectric layer 110. Then, a metal layer (e.g., a copper layer) is formed on the first dielectric layer 110 and filled into the first opening 112. Thereafter, a chemical mechanical polishing process is applied to the metal layer so that a portion of the metal layer outside the first opening 112 is removed. Thus, the first damascene electrode layer 120 is formed and filled in the first opening 112. In the present embodiment, the first damascene electrode layer 120 is a copper damascene layer.

Figure 1B:
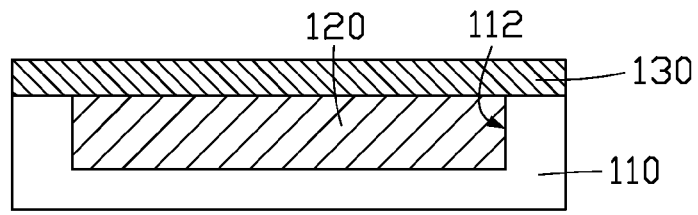

Referring to FIG. 1B, next, an insulating barrier layer 130 is formed to cover the first dielectric layer 110 and the first damascene electrode layer 120. The insulating barrier layer 130 is a single layer structure. A material of the insulating barrier layer 130 can include silicon nitride (SiN), silicon carbide (SiC), silicon carbonitride (SiCN), silicon oxynitride (SiON) or other high dielectric constant materials. In the present embodiment, a dielectric constant of the insulating barrier layer 130 is, for example, 5. A thickness of the insulating barrier layer 130 is in a range from 200 to 1500 angstroms.

Figure 1C:
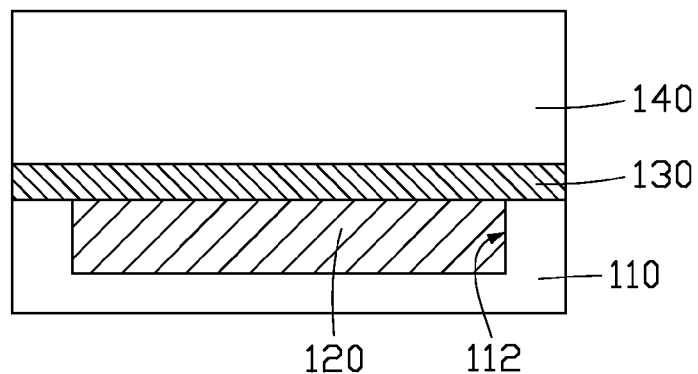

Referring to FIG. 1C, next, a second dielectric 140 is formed on and contacted with the insulating barrier layer 130. In the present embodiment, a material of the second dielectric 140 and a material of the first dielectric layer 110 are, for example, oxide.

Figure 1D:
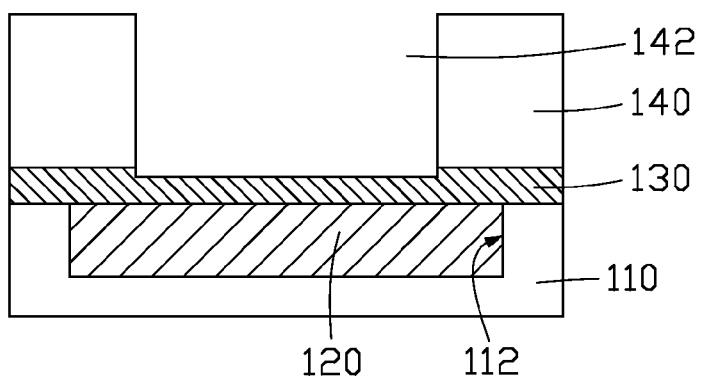
Figure 1E:
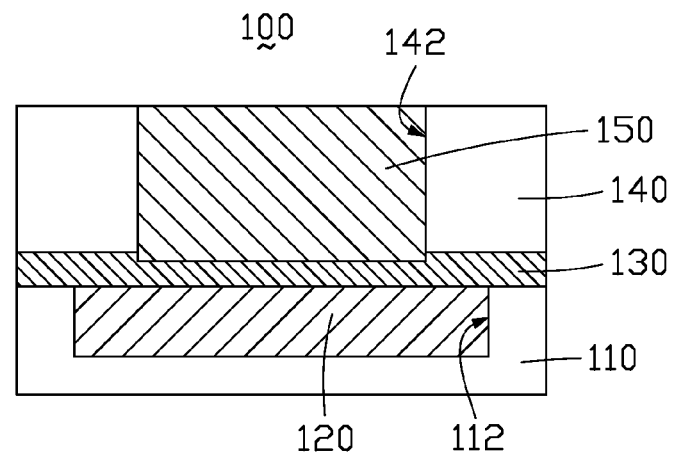

Referring to FIG. 1D to FIG. 1E, in the present embodiment, for example, a second damascene electrode layer 150 is formed in the second dielectric layer 140 by a damascene process. In detail, at first, referring to FIG. 1D, a second opening 142 is formed in the second dielectric layer 140 and is located above the first damascene electrode layer 120 so as to expose a portion of the insulating barrier layer 130.

During forming the second opening 142 in the second dielectric layer 140, the insulating barrier layer 130 can serve as an etch stop layer. That is, due to the etching selectivity of the second dielectric layer 140 and the insulating barrier layer 130, the etching process for forming the second opening 142 in the second dielectric layer 140 will stop on the insulating barrier layer 130. Thus, after the second opening 142 is formed, a portion of insulating barrier layer 130 is exposed from the second opening 142.

Referring to FIG. 1E, next, a metal layer (e.g., a copper layer) is formed on the second dielectric layer 140 and filled into the second opening 142 to cover the portion of the insulating barrier layer 230 exposed from the second opening 142. Then, a chemical mechanical polishing process is applied to the metal layer so that a portion of the metal layer outside the second opening 142 is removed. Thus, the second damascene electrode layer 150 contacted with the insulating barrier layer 130 is formed and filled in the second opening 142. In the present embodiment, the second damascene electrode layer 150 is a copper damascene layer.

After the second damascene electrode layer 150 is formed, the MIM capacitor 100 is manufactured by the method in accordance with the first embodiment. In detail, the MIM capacitor 100 includes the first dielectric layer 110, the first damascene electrode layer 120, the insulating barrier layer 130, the second dielectric layer 140 and the second damascene electrode layer 150. The first damascene electrode layer 120 is formed in the first dielectric layer 110. The insulating barrier layer 130 covers the first dielectric layer 110 and the first damascene electrode layer 120, and is the single layer structure. The second dielectric layer 140 is formed on and contacted with the insulating barrier layer 130. The second damascene electrode layer 150 is formed in the second dielectric layer 140, is located above the first damascene electrode layer 120 and is contacted with the insulating barrier layer 130.

Particularly, in the MIM capacitor 100, the insulating barrier layer 130 can further serve as a capacitor dielectric layer between the first damascene electrode layer 120 and the second damascene electrode layer 150. In other words, in the method for manufacturing the MIM capacitor 100, it is not necessary to deposit extra dielectric layers between the two electrode layers (i.e., the first damascene electrode layer 120 and the second damascene electrode layer 150). Thus, the method can reduce the production cost of the MIM capacitor and manufacture the MIM capacitor 100 with a simple structure.

It is noted that, during forming the second opening 142, a portion of the insulating barrier layer 130 can be etched due to an over etch effect. Thus, after forming the second opening 142, a final thickness of the insulating barrier layer 130 is determined by an original deposition thickness of the insulating barrier layer 130 and an etching rate of an etchant for etching the second dielectric layer 140 to the insulating barrier layer 130.

Figure 2:
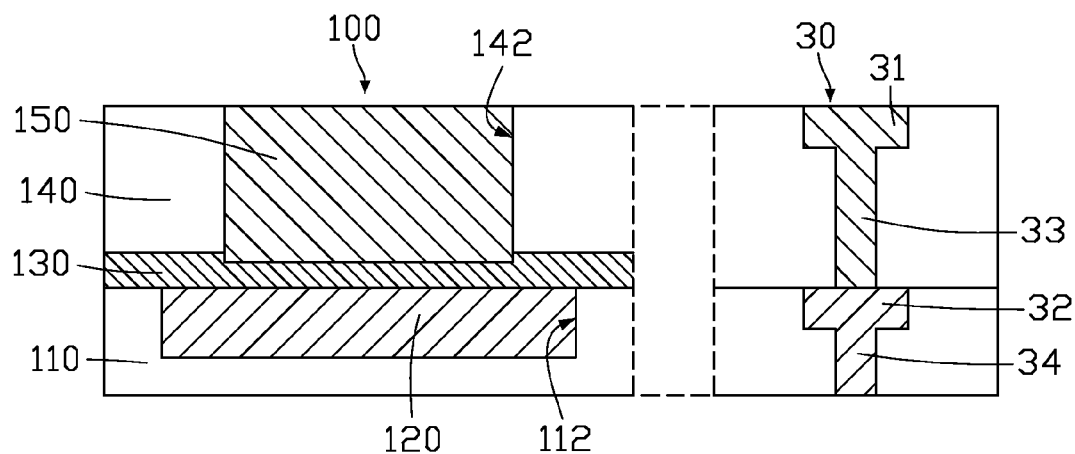
FIG. 2 illustrates a schematic view of a MIM capacitor with an interconnection structure in accordance with the first embodiment of the present invention.

According to the method for manufacturing the MIM capacitor 100, it is also noted that, the fabrication of the MIM capacitor 100 can be integrated with a fabrication of an interconnection structure. FIG. 2 illustrates a schematic view of a MIM capacitor with an interconnection structure of an integrated circuit. Referring to FIG. 2, in the present embodiment, an interconnection structure 30, for example, a dual damascene interconnection structure, is shown, which includes conductive wire layers 31, 32 and contact plugs 33, 34 electrically connecting the first conductive layers 31, 32. To integrate the process, the interconnection structure 30 is formed in the first dielectric layer 110 and the second dielectric layer 140. The conductive wire layer 31 and the contact plug 33 can be formed in the process of forming the first damascene electrode layer 120. The conductive wire layer 32 and the contact plug 34 can be formed in the process of forming the second damascene electrode layer 150. It is noted that, the insulating barrier layer 130 may not formed in the region for forming the interconnection structure 30.

FIGS. 3A-3H illustrate a process flow of a method for manufacturing a MIM capacitor in accordance with a second embodiment of the present invention.

Figure 3A:
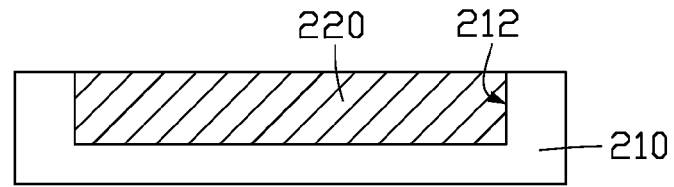
FIGS. 3A-3H illustrate a process flow of a method for manufacturing a MIM capacitor in accordance with a second embodiment of the present invention.

Referring to FIG. 3A, in the present embodiment, for example, a first damascene electrode layer 220 is formed in a first dielectric layer 210 by a damascene process. In detail, at first, a first opening 212 is formed in the first dielectric layer 210. Then, a metal layer (e.g., a copper layer) is formed on the first dielectric layer 210 and filled into the first opening 212. Thereafter, a chemical mechanical polishing process is applied to the metal layer so that a portion of the metal layer outside the first opening 212 is removed. Thus, the first damascene electrode layer 220 is formed and filled in the first opening 212. In the present embodiment, the first damascene electrode layer 220 is a copper damascene layer.

Figure 3B:
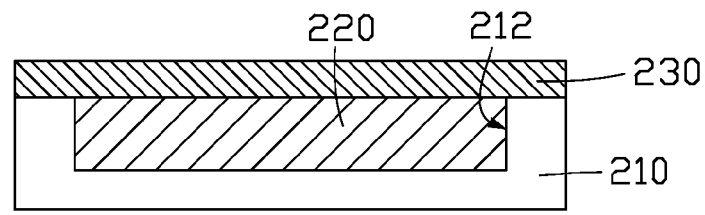

Referring to FIG. 3B, next, an insulating barrier layer 230 is formed to cover the first dielectric layer 210 and the first damascene electrode layer 220. The insulating barrier layer 230 can be a single layer structure. A material of the insulating barrier layer 230 can include silicon nitride (SiN), silicon carbide (SiC), silicon carbonitride (SiCN), silicon oxynitride (SiON) or other high dielectric constant materials. A thickness of the insulating barrier layer 130 is in a range from 200 to 1500 angstroms. The insulating barrier layer 230 can also be a multilayer structure, for example, including a first insulating layer (not shown) and a second insulating layer (not shown). The first insulating layer is formed on the first dielectric layer 210 and the first damascene electrode layer 220 and the second insulating layer is formed on the first insulating layer. A material of the first insulating layer is selected from a group consisting of silicon nitride (SiN), silicon carbide (SiC), silicon carbonitride (SiCN) and silicon oxynitride (SiON). A material of the second insulating layer is selected from a group consisting of undoped silicate glass (USG), tantalum oxide ($Ta_2O_5$), zirconium oxide ($ZrO_2$) and aluminum oxide ($Al_2O_3$). A thickness of the first insulating layer is in a range from 200 to 1500 angstroms. A thickness of the second insulating layer is in a range from 100 to 1000 angstroms.

Figure 3C:
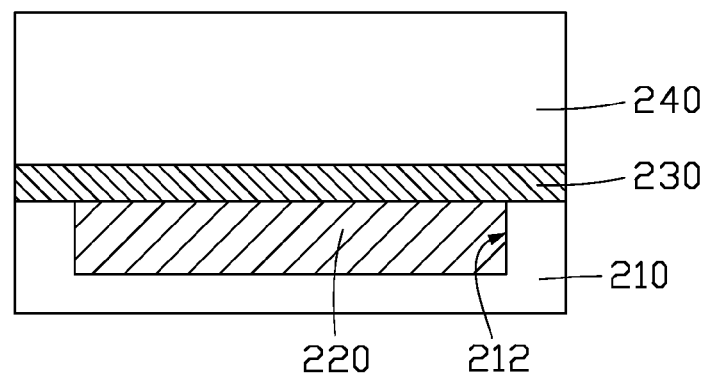

Referring to FIG. 3C, next, a second dielectric 240 is formed on and contacted with the insulating barrier layer 230. In the present embodiment, a material of the second dielectric 240 and a material of the first dielectric layer 210 are, for example, oxide. The method for manufacturing the MIM capacitor in the second embodiment is similar to the method for manufacturing the MIM capacitor in the first embodiment except the following steps after forming the second dielectric 240.

Referring to FIG. 3D to FIG. 3H, in the present embodiment, for example, a second damascene electrode layer 250 is formed in the second dielectric layer 240 by a damascene process and a dual damascene structure 260 is formed in the second dielectric layer 240 and the insulating barrier layer 230 by a dual damascene process. It is noted that, in fact, the second damascene electrode layer 250 and the dual damascene structure 260 are formed in a common damascene process.

Figure 3D:
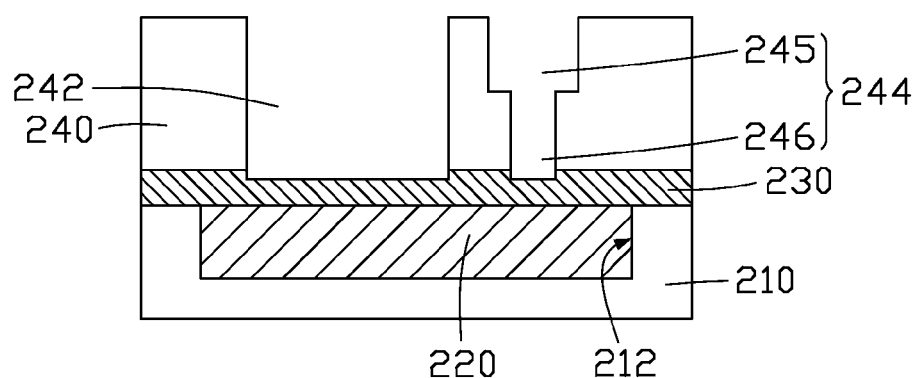
Figure 3E:
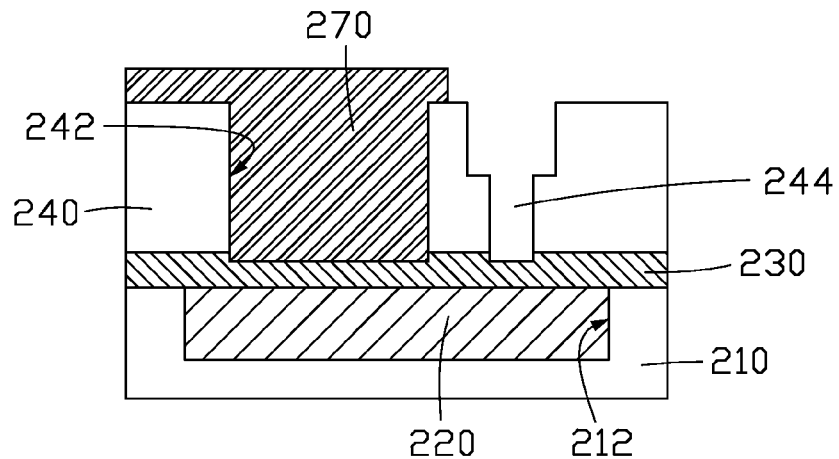

In detail, referring to FIG. 3D, a second opening 242 and a third opening 244 are formed in the second dielectric layer 240 and are located above the first damascene electrode layer 220 so as to expose a portion of the insulating barrier layer 230, respectively. The third opening 244 includes at least a via 246 and a trench 245 located above and communicated with the via 246. In the present embodiment, the third opening 244 includes one trench 245 and one via corresponding to the one trench 245. In another embodiment, the third opening can also includes one trench and a number of vias. In other words, the number and the location of the trench 245 and the via 246 are determined by the interconnection demand. It is noted that, the third opening 244 can be formed by a trench first process, a via first process or a self-aligned process, which are not described here.

For example, the second opening 242 and the third opening 244 can be formed by a photolithography process. During forming the second opening 242 and the third opening 244 in the second dielectric layer 140, the insulating barrier layer 230 can serve as an etch stop layer. That is, due to the etching selectivity of the second dielectric layer 240 and the insulating barrier layer 230, the etching process for forming the second opening 242 and the third opening 244 in the second dielectric layer 240 will stop on the insulating barrier layer 230. Thus, after the second opening 242 and the third opening 244 are formed, a portion of insulating barrier layer 230 is exposed from the second opening 242 and the third opening 244, respectively.

It is noted that, during forming the second opening 242 and the third opening 244, a portion of the insulating barrier layer 230 can be etched due to an over etch effect. Thus, after forming the second opening 242 and the third opening 244, a final thickness of the insulating barrier layer 230 is determined by an original deposition thickness of the insulating barrier layer 230 and an etching rate of an etchant for etching the second dielectric layer 240 to the insulating barrier layer 230.

Next, the portion of the insulating barrier layer 230 exposed from the third opening 244 is removed so as to expose a portion of the first damascene electrode layer 220, thereby forming the dual damascene opening 262. In the present embodiment, referring to FIG. 3E, a patterned mask layer 270 is formed on the second dielectric layer 240 to cover the second dielectric layer 240 and the second opening 242 and to expose the third opening 244. For example, a material of the patterned mask layer 270 can be a photoresist material.

Figure 3F:
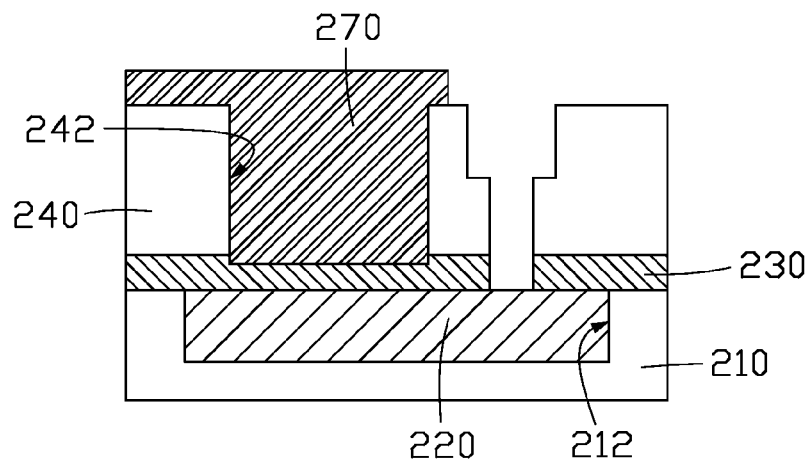
Figure 3G:
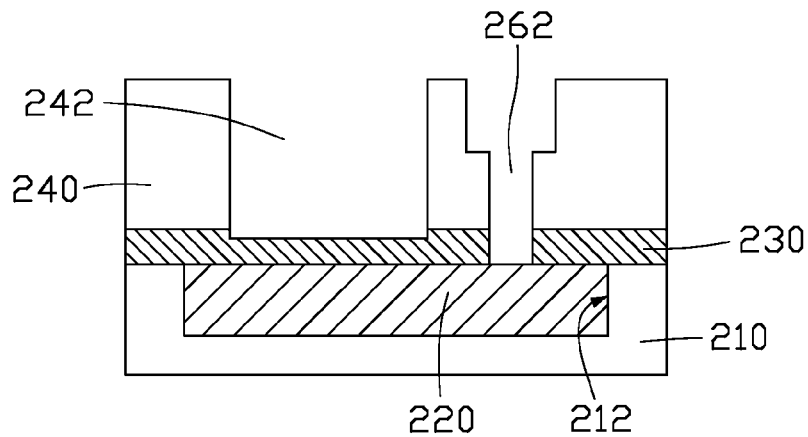

Referring to FIG. 3F, next, the portion of the insulating barrier layer 230 exposed from the patterned mask 270 is removed. For example, an etchant for etching the insulating barrier layer 230 is selected to etch the insulating barrier layer 230 exposed from the patterned mask 270 so that the portion of the insulating barrier layer 230 exposed from the patterned mask 270 is removed so as to expose the portion of the first damascene electrode layer 220. It is noted that, other suitable method for removing the portion of the insulating barrier layer 230 exposed from the patterned mask 270 can also be used. Referring to 3G, next, the patterned mask layer 270 is removed, thereby forming the dual damascene opening 262 in the second dielectric layer 240 and the insulating barrier layer 230.

Figure 3H:
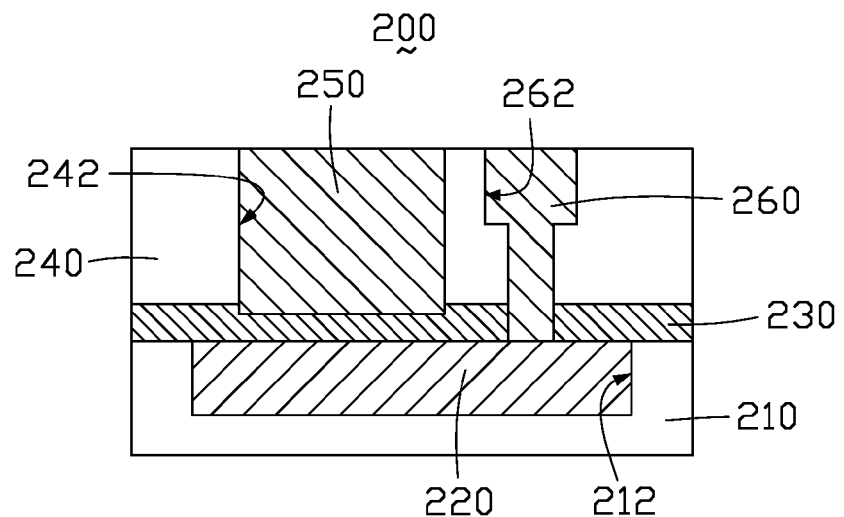

Referring to FIG. 3H, next, a metal layer (e.g., a copper layer) is formed on the second dielectric layer 240 and is filled into the second opening 242 to cover the portion of the insulating barrier layer 230 exposed from the second opening 242 and is filled into the dual damascene opening 262 to cover the portion of the first damascene electrode layer 220 exposed from the dual damascene opening 262. Then, a chemical mechanical polishing process is applied to the metal layer so that a portion of the metal layer outside the second opening 242 and the dual damascene opening 262 is removed. Thus, the second damascene electrode layer 250 contacted with the insulating barrier layer 230 is formed and filled in the second opening 242, and the dual damascene structure 260 electrically connected to the first damascene electrode layer 220 is formed and filled in the dual damascene opening 262. In the present embodiment, the second damascene electrode layer 250 is a copper damascene layer, and the dual damascene structure 260 is a copper dual damascene layer. That is, a material of the second damascene electrode layer 250 is identical to a material of the dual damascene structure 260.

Still, referring to FIG. 3H, the MIM capacitor 200 is manufactured by the method in accordance with the second embodiment. The MIM capacitor 200 includes the first dielectric layer 210, the first damascene electrode layer 220, the insulating barrier layer 230, the second dielectric layer 240, the second damascene electrode layer 250 and the dual damascene structure 260. The first damascene electrode layer 220 is filled in the first dielectric layer 210. The insulating barrier layer 230 is formed on the first dielectric layer 210 and the first damascene electrode layer 220. The second dielectric layer 240 is formed on the insulating barrier layer 230. The second damascene electrode layer 250 is formed in the second dielectric layer 240, is located above the first damascene electrode layer 220 and is contacted with the insulating barrier layer 230. The dual damascene structure 260 is formed in the second dielectric layer 240 and the insulating barrier layer 230, is located above the first damascene electrode layer 220 and is electrically connected to the first damascene electrode layer 220.

In the present embodiment, the second damascene electrode layer 250 and the dual damascene structure 260 are formed at the same time by using a dual damascene process. Thus, it is not necessary to deposit extra dielectric layers and metal layers, thereby simplifying the MIM capacitor 200 with the interconnection structure and reducing the production cost. Thus, the method can reduce the production cost of the MIM capacitor and manufacture the MIM capacitor 100 with a simple structure. Furthermore, the insulating barrier layer 230 can further serve as an etch stop layer and a capacitor dielectric layer between the first damascene electrode layer 220 and the second damascene electrode layer 250. In other words, in the method for manufacturing the MIM capacitor 200, it is not necessary to deposit extra dielectric layers between the two electrode layers (i.e., the first damascene electrode layer 220 and the second damascene electrode layer 250).

Figure 4:
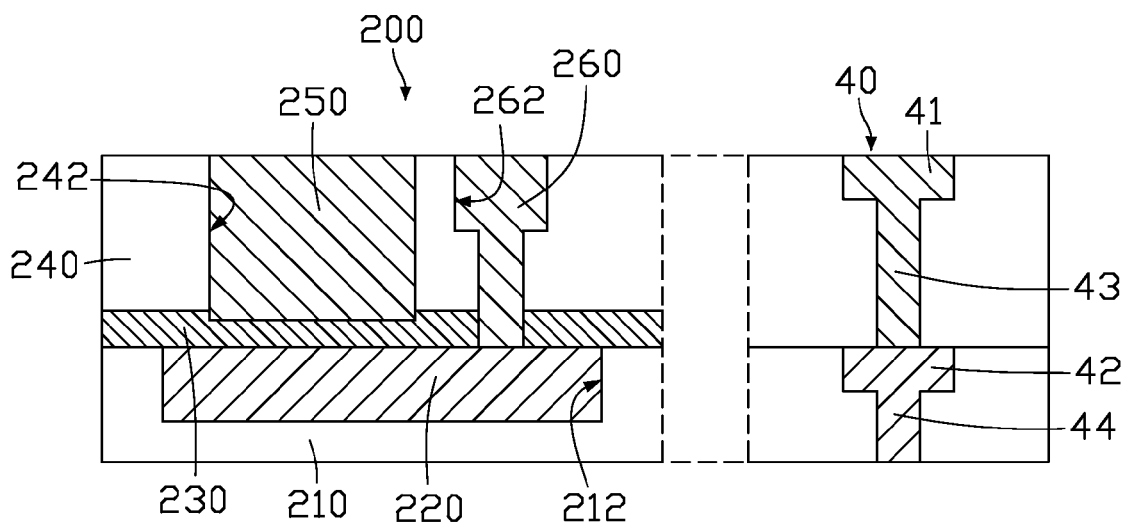
FIG. 4 illustrates a schematic view of a MIM capacitor with an interconnection structure in accordance with the second embodiment of the present invention.

According to the method for manufacturing the MIM capacitor 200, it is also noted that, the fabrication of the MIM capacitor 200 can be integrated with a fabrication of an interconnection structure of an integrated circuit. FIG. 4 illustrate a schematic view of a MIM capacitor with an interconnection structure of an integrated circuit. Referring to FIG. 4, in the present embodiment, an interconnection structure 40, for example, a dual damascene interconnection structure, is shown, which includes conductive wire layers 41, 42 and contact plugs 43, 44 electrically connecting the conductive layers 41, 42. To integrate the process, the interconnection structure 40 is formed in the first dielectric layer 210 and the second dielectric layer 240. The first conductive wire layer 41 and the contact plug 43 can be formed in the process of forming the second damascene electrode layer 250 and the dual damascene structure 260, the second conductive wire layer 42 and the contact plug 44 can be formed in the process of forming the first damascene electrode layer 220. It is noted that, the insulating barrier layer 230 may not formed in the region for forming the interconnection structure 40.

In the MIM capacitor and the method for manufacturing the MIM capacitor of the present invention, the first damascene electrode layer and the second damascene electrode layer are both formed by a damascene process and are separated by the insulating barrier layer. The insulating barrier can serve as not only an insulator of the MIM capacitor, but also an etch stop layer during forming the second damascene electrode layer. Thus, the MIM capacitor has a simple structure, thereby reducing the production cost. In another embodiment, the MIM capacitor can further includes the dual damascene structure formed in the second dielectric layer and the insulating barrier layer and electrically connected to the first damascene electrode layer. The dual damascene structure and the second damascene electrode layer can be formed in a common step. Thus, the process of integrating the MIM capacitor with an interconnection structure can be simplified, thereby reducing the production cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A MIM capacitor structure, comprising:
    a first dielectric layer;
    a first damascene electrode layer formed in the first dielectric layer and being a bottom electrode of the MIM capacitor;
    an insulating barrier layer formed on the first dielectric layer and the first damascene electrode layer;
    a second dielectric layer formed on the insulating barrier layer; and
    a second damascene electrode layer formed in the second dielectric layer, located on the first damascene electrode layer, contacted with the insulating barrier layer, and being a top electrode of the MIM capacitor; and
    a dual damascene structure formed in the second dielectric layer and the insulating barrier layer, located on and in direct contact with the first damascene electrode layer and electrically connected to the first damascene electrode layer.

2. The MIM capacitor structure as claimed in claim 1, wherein the insulating barrier layer is a single layer structure.

3. The MIM capacitor structure as claimed in claim 1, wherein a material of insulating barrier layer is selected from a group consisting of silicon nitride (SiN), silicon carbide (SiC), silicon carbonitride (SiCN) and silicon oxynitride (SiON).

4. The MIM capacitor structure as claimed in claim 2, wherein a material of the first damascene electrode layer and a material of the second damascene electrode layer each are copper.

5. The MIM capacitor structure as claimed in claim 2, wherein a material of the second damascene electrode layer is identical to a material of the dual damascene structure.

6. The MIM capacitor structure as claimed in claim 1, wherein the insulating barrier layer is a multilayer structure.

7. The MIM capacitor structure as claimed in claim 6, wherein the multilayer structure comprises a first insulating layer formed on the first dielectric layer and a second insulating layer formed on the first insulating layer, a material of the first insulating layer is selected from a group consisting of silicon nitride (SiN), silicon carbide (SiC), silicon carbonitride (SiCN) and silicon oxynitride (SiON), and a material of the second insulating layer is selected from a group consisting of undoped silicate glass (USG), tantalum oxide ($Ta_2O_5$), zirconium oxide ($ZrO_2$) and aluminum oxide ($Al_2O_3$).

8. The MIM capacitor structure as claimed in claim 1, wherein the dual damascene structure comprises a conductive wire layer and a contact plug, and the contact plug is in direct contact with the first damascene electrode layer.

* * * * *